US008698231B2

(12) United States Patent
Lee et al.

(10) Patent No.: US 8,698,231 B2

(45) Date of Patent: Apr. 15, 2014

(54) SEMICONDUCTOR DEVICE AND METHOD OF MANUFACTURING THE SAME

(75) Inventors: Ki Hong Lee, Suwon-si (KR); Seung Ho Pyi, Seongnam-si (KR); Jin Ho Bin, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 3 days.

(21) Appl. No.: 13/600,190

(22) Filed: Aug. 30, 2012

(65) Prior Publication Data

US 2013/0207182 A1 Aug. 15, 2013

(30) Foreign Application Priority Data

Feb. 9, 2012 (KR) ........................ 10-2012-0013320

(51) Int. Cl.

*H01L 21/20* (2006.01)

*H01L 29/78* (2006.01)

(52) U.S. Cl.

USPC ............... 257/329; 257/E29.262; 257/E21.09

(58) Field of Classification Search

USPC ............................ 257/329, E29.262, E21.09

See application file for complete search history.

(56) References Cited

U.S. PATENT DOCUMENTS 5,985,726 A * 11/1999 Yu et al. ........................ 438/301

2012/0168858 A1* 7/2012 Hong ............................ 257/330

* cited by examiner

*Primary Examiner* — Matthew W Such

*Assistant Examiner* — Monica D Harrison

(74) *Attorney, Agent, or Firm* — William Park & Associates Patent Ltd.

(57) ABSTRACT

A semiconductor device includes vertical channel layers, a pipe channel layer coupling bottoms of the vertical channel layers, a pipe gate contacting a bottom surface and side surfaces of the pipe channel layer, and a dummy pipe gate formed of a non-conductive material and contacting a top surface of the pipe channel layer.

12 Claims, 7 Drawing Sheets

39 40 38 37 36 35 34 43 32 31 30

SEMICONDUCTOR DEVICE AND METHOD OF MANUFACTURING THE SAME

CROSS-REFERENCE TO RELATED APPLICATION

The present application claims priority to Korean patent application number 10-2012-0013320 filed on Feb. 9, 2012, in the Korean Intellectual Property Office, the entire disclosure of which is incorporated by reference herein.

BACKGROUND

1. Technical Field

Various embodiments relate generally to a semiconductor device and a method of manufacturing the same and, more particularly, to a three-dimensional non-volatile memory device including a pipe gate and a method of manufacturing the same.

2. Related Art

A non-volatile memory device can retain data stored therein even in the absence of a power supply. Because creating two-dimensional memory devices that have memory cells fabricated in the form of a single layer on silicon substrates is reaching a limitation in regards to integration, suggestions of three-dimensional structured non-volatile memory devices that have memory cells vertically stacked on silicon substrates have been proposed.

The structure and features of a conventional three-dimensional (3-D) non-volatile memory device are described with reference to FIG. 1.

FIG. 1 is a perspective view illustrating the structure of a conventional 3-D non-volatile memory device. For illustration purposes, interlayer insulating layers are not depicted.

As illustrated in FIG. 1, the conventional 3-D non-volatile memory device may include channel layers CH. Each of the channel layers CH may include a pipe channel layer P_CH formed on a pipe gate PG and a pair of vertical channel layers V_CH coupled to the pipe channel layer P_CH. Each of the channel layers CH may be surrounded by a memory layer (not illustrated). The memory layer may include a tunnel insulating layer, a charge trap layer and a charge blocking layer.

In addition, the memory device may include stacked word lines WL that surround the vertical channel layers V_CH, a source select line SSL and a drain select line DSL each stacked above the word lines WL, a source line SL, and bit lines BL.

One drawback for the conventional 3-D non-volatile memory device is that, when a slit is formed in order to separate a source side word line and a drain side word line from each other, a pipe channel layer P_CH and the memory layer that surround the pipe channel layer P_CH may be damaged.

In addition, the memory layer surrounding the pipe channel layer P_CH may be configured to be used as a gate insulating layer of a pipe transistor, and if it is not thick enough to function as a gate insulating layer, charges may be trapped in the charge trap layer during a program or erase operation, thereby varying the threshold voltage of the pipe transistor.

BRIEF SUMMARY

An embodiment relates to a semiconductor device to prevent damage to a pipe channel layer and a memory layer surrounding the pipe channel layer, and a method of manufacturing the same.

A semiconductor device according to an embodiment of the present invention includes vertical channel layers, a pipe channel layer coupling bottoms of the vertical channel layers, a pipe gate contacting a bottom surface and side surfaces of the pipe channel layer, and a dummy pipe gate formed of a non-conductive material and contacting a top surface of the pipe channel layer.

A method of manufacturing a semiconductor device according to another embodiment of the present invention includes forming a first conductive layer for a pipe gate, wherein the first conductive layer includes a trench filled with a sacrificial layer, forming a first material layer for a dummy pipe gate over the first conductive layer, wherein the first material layer is a non-conductive material, and alternately forming second material layers for word lines and third material layers for interlayer insulating layers over the first material layer.

DETAILED DESCRIPTION

Figure 1:
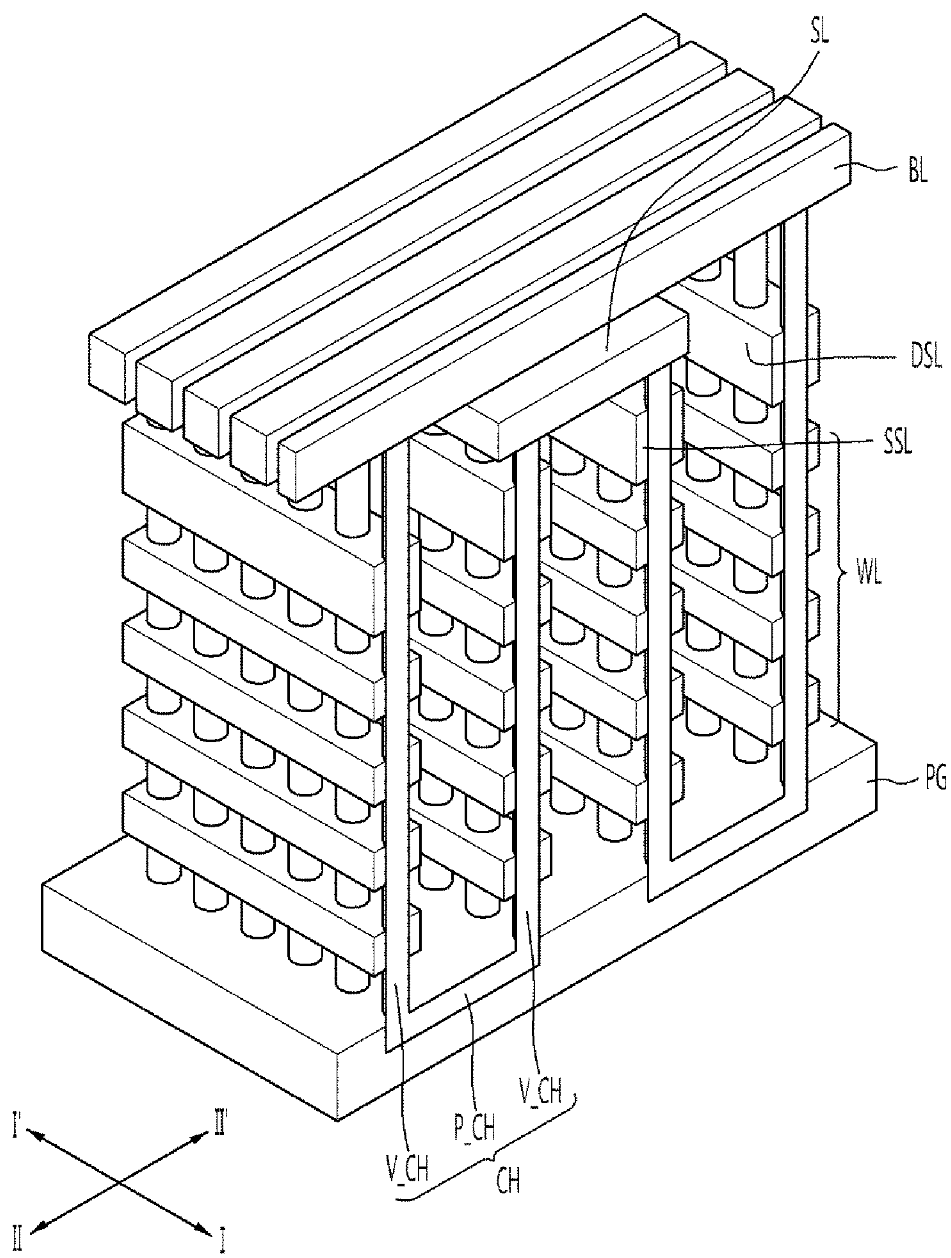
FIG. 1 is a perspective view illustrating the structure of a conventional three-dimensional (3-D) non-volatile memory device.

Hereinafter, various embodiments of the present disclosure will be described in detail with reference to the accompanying drawings. The drawings are not necessarily to scale and in some instances, proportions may have been exaggerated in order to clearly illustrate features of the embodiments. Moreover, detailed descriptions related to well-known functions or configurations will be ruled out in order not to unnecessarily obscure subject matters of the present invention. Like reference numerals in the drawings denote like elements.

Figure 2:
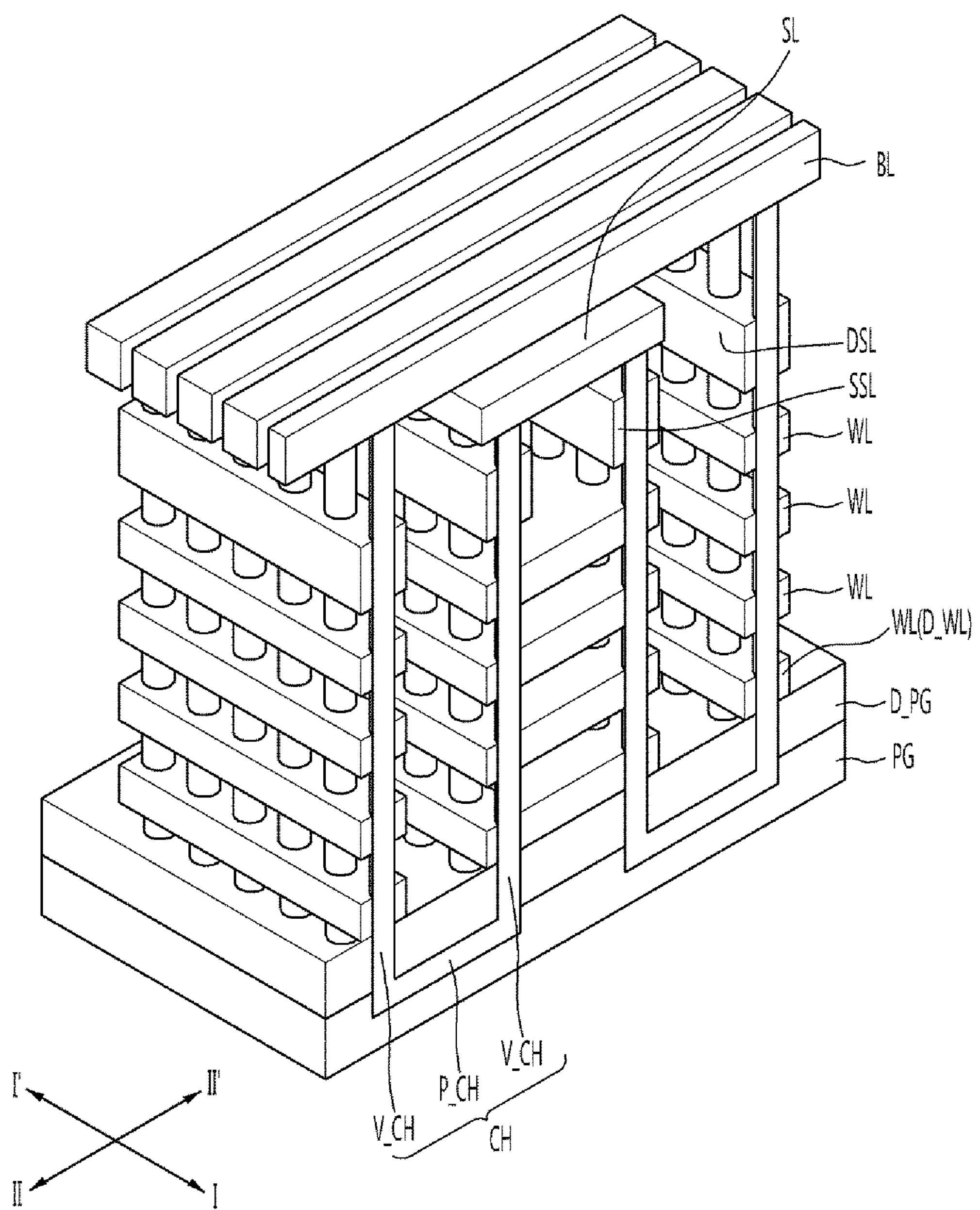
FIG. 2 is a perspective view illustrating the structure of a semiconductor device according to an embodiment of the present invention.

FIG. 2 is a perspective view illustrating the structure of a semiconductor device according to an embodiment of the present invention. For illustration purposes, interlayer insulating layers are not depicted.

As illustrated in FIG. 2, the semiconductor device may include vertical channel layers V_CH and pipe channel layers P_CH coupling bottoms of the vertical channel layers V_CH to provide a U-shape for the collective channel layers. For example, each of the pipe channel layers P_CH may couple bottoms of a pair of the vertical channel layers V_CH. Each of the channel layers CH may be surrounded by a memory layer (not illustrated), which may include a tunnel insulating layer, a charge trap layer and a charge blocking layer.

The semiconductor device further includes a pipe gate PG that contacts the bottom and side surfaces of the pipe channel layer P_CH and a dummy pipe gate D_PG that contacts the top surface of the pipe channel layer P_CH and the top surface of the pipe gate PG.

The pipe gate PG may be formed of a polysilicon layer that includes various types of impurities. For example, the pipe gate PG may be formed of a polysilicon layer that includes a first type of impurities, or the pipe gate PG may include a stacked structure of polysilicon layers alternately including a first and second types of impurities different from each other. Each of the first and second types may be of N type and P type, respectively.

The dummy pipe gate D_PG may contact the top surface of the pipe gate PG and the top surface of the pipe channel layer P_CH. Since the dummy pipe gate D_PG may be configured to be used as a dummy that does not function as a pipe gate, the dummy pipe gate D_PG may be formed of a non-conductive material that does not conduct current. For example, the dummy pipe gate D_PG may be formed of a polysilicon layer with no impurities.

The semiconductor device may further include word lines WL and interlayer insulating layers (not illustrated) interposed between the word lines WL. The word lines WL may surround the vertical channel layers V_CH and may be stacked upon one another on the dummy pipe gate D_PG. The lowermost word line among the word lines WL may contact the top surface of the dummy pipe gate D_PG. In this case, since the dummy pipe gate D_PG may be formed of a non-conductive material, such as a polysilicon layer with no impurities, the pipe gate PG and the lowermost word line WL may be separately operated.

However, the lowermost word line that contacts the dummy pipe gate D_PG may serve as a dummy word line D_WL. Although the same or different bias voltages may be applied to the dummy word line D_WL and the other word lines WL, memory cells that are coupled to the dummy word line D_WL may not be useful for substantial data storage.

The semiconductor device may further include at least one source select line SSL and at least one drain select line DSL that are each stacked over the word lines WL. Slits through which the dummy pipe gate D_PG is exposed may be formed between the vertical channel layers V_CH, between every two vertical channel layers V_CH, or between some of the vertical channel layers V_CH.

In addition, the semiconductor device may further include bit lines BL and a source line SL. Adjacent strings in a second direction II-II' may be coupled in common to both the source line SL and to one of the bit lines BL.

According to the above-described structure of the semiconductor device, the dummy pipe gate D_PG may be formed between the lowermost word line WL and the pipe gate PG. In particular, the dummy pipe gate D_PG may be formed to contact the bottom surface of the lowermost word line WL and the top surface of the pipe gate PG. To prevent current from flowing through the dummy pipe gate D_PG, the dummy pipe gate D_PG may be formed of a polysilicon layer with no impurities.

The region corresponding to the pipe gate PG other than the dummy pipe gate D_PG may serve as a pipe transistor. More specifically, the bottom surface and the side surfaces of the pipe channel layer P_CH may serve as a channel layer of the pipe transistor. Therefore, in addition to the memory layer that already surrounds each channel layer CH, an insulating layer that surrounds the bottom surface and the side surfaces of the pipe channel layer P_CH may be additionally formed to increase the thickness of the gate insulating layer of the pipe transistor, so that charge trapping may be prevented during a program or erase operation.

FIGS. 3A to 3F are cross-sectional views illustrating the process flow of a semiconductor device according to another embodiment of the present invention.

Figure 3A:
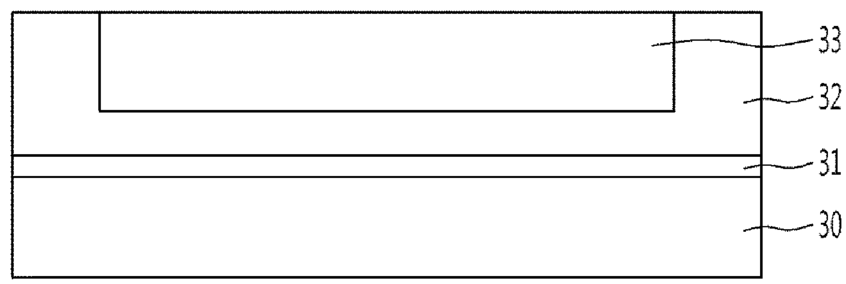
FIGS. 3A to 3F are cross-sectional views illustrating the process flow of a method of manufacturing a semiconductor device according to another embodiment of the present invention.

As illustrated in FIG. 3A, an insulating layer 31 may be formed on a substrate 30 and may function as an interlayer insulating layer that electrically insulates the substrate 30 from the pipe gate PG.

A first conductive layer 32 may be formed on the insulating layer 31 and may form the pipe gate PG. The first conductive layer 32 may comprise a polysilicon layer including impurities. For example, the first conductive layer 32 may comprise a polysilicon layer including N type impurities such as phosphor (P) or arsenic (As), or a combination of polysilicon layers each including P type or N type.

The first conductive layer 32 may be etched to form trenches for a pipe channel layer. In FIG. 3A, a single trench is illustrated. However, a plurality of trenches may be arranged in a matrix form.

Figure 3B:
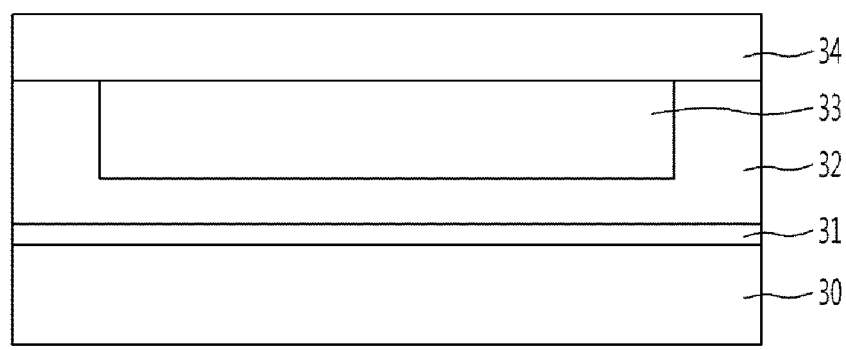

A sacrificial layer 33, comprising of silicon nitride or titanium nitride, may be formed in each trench. For this to occur, once the sacrificial layer 33 is formed over the entire structure including the trenches, a planarization process may be performed until the surface of the first conductive layer 32 is exposed As illustrated in FIG. 3B, a first material layer 34 for a dummy pipe gate may be formed over the first conductive layer in which the sacrificial layer 33 is formed. The first material layer 34 may not include impurities, and may comprise of an undoped polysilicon layer.

Figure 3C:
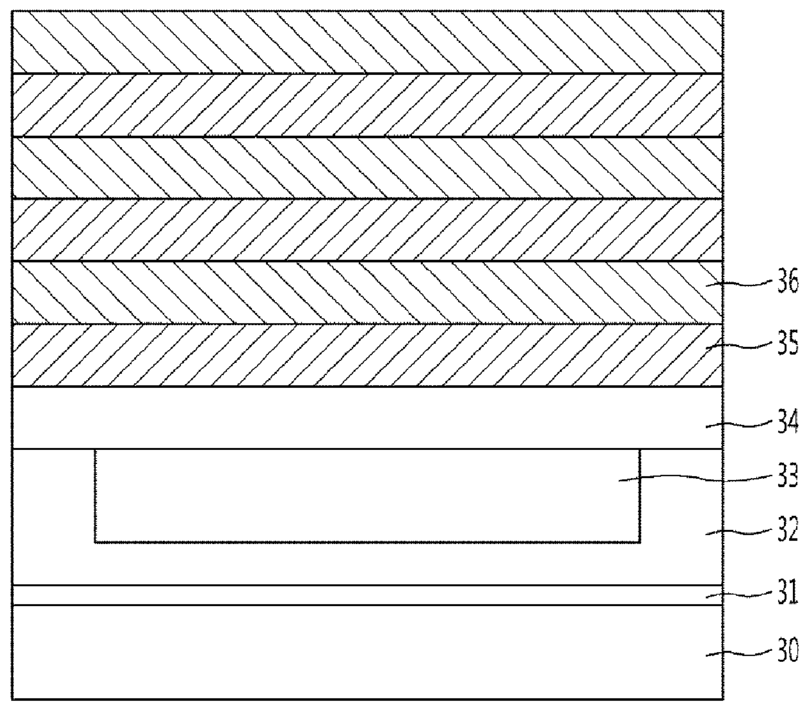

As illustrated in FIG. 3C, second material layers 35 for word lines and third material layers 36 for interlayer insulating layers may be alternately formed over the first material layer 34. The lowermost second material layer 35 among the second material layers 35 may contact a top surface of the first material layer 34. In addition, at least one of the uppermost second material layers 35, among the second material layers 35 stacked upon one another, may be configured to be used as a select line.

The second material layer 35 and the third material layer 36 may be formed of materials having various etch selectivity. For example, the second material layer 35 may comprise a conductive layer such as a polysilicon layer, and the third material layer 36 may comprise an insulating layer such as an oxide layer. In another example, the second material layer 35 may comprise a conductive layer such as a doped polysilicon layer or a doped amorphous silicon layer. The third material layer 36 may comprise a sacrificial layer such as an undoped polysilicon layer or an undoped amorphous silicon layer. In yet another example, the second material layer 35 may comprise a sacrificial layer such as a nitride layer, and the third material layer 36 may comprise an insulating layer such as an oxide layer.

Figure 3D:
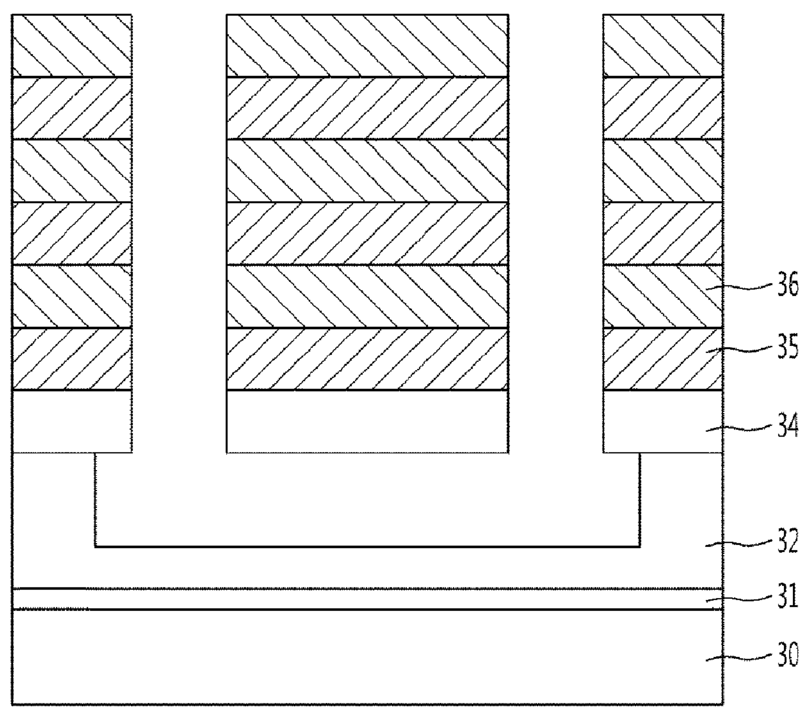

As illustrated in FIG. 3D, the second material layers 35, the third material layers 36 and the first material layer 34 may be etched to form channel holes, which may couple each trench to the channel holes.

The sacrificial layer 33 exposed at bottom surfaces of the channel holes may be removed. As a result, U-shaped trenches may be formed. Each of the U-shaped trenches may include a trench and a pair of channel holes coupled to the trench.

Figure 3E:
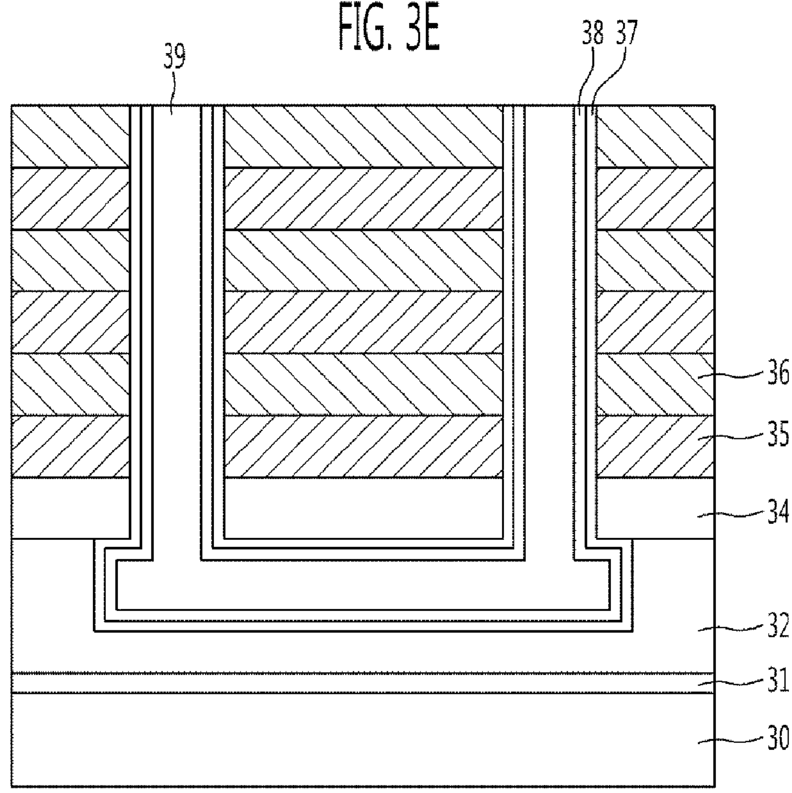

As illustrated in FIG. 3E, a memory layer 37 may be formed along an inner surface of the U-shaped trench. The memory layer 37 may be formed of a charge blocking layer, a charge trap layer and a tunnel insulating layer. The memory layer 37 formed in the trench may function as a gate insulating layer of a pipe transistor.

The channel layer 38 may be formed on the memory layer 37. The part formed in the trench may function as a pipe channel layer, and the partformed in the channel holes may be configured to be used as a vertical channel layer. The channel layer 38 may comprise a semiconductor layer such as a polysilicon layer.

The channel layer 38 may be formed such that the U-shaped trench may be completely filled with the channel layer 38. Alternatively, the channel layer 38 may be formed such that the U-shaped trench may have an open central region. When the U-shaped trench has an open central region, the open central region may be filled with an insulating layer 39. The insulating layer 39 may comprise a flowable insulating layer such as a polysilazane (PSZ) layer or a Spin On dielectric (SOD) layer.

Figure 3F:
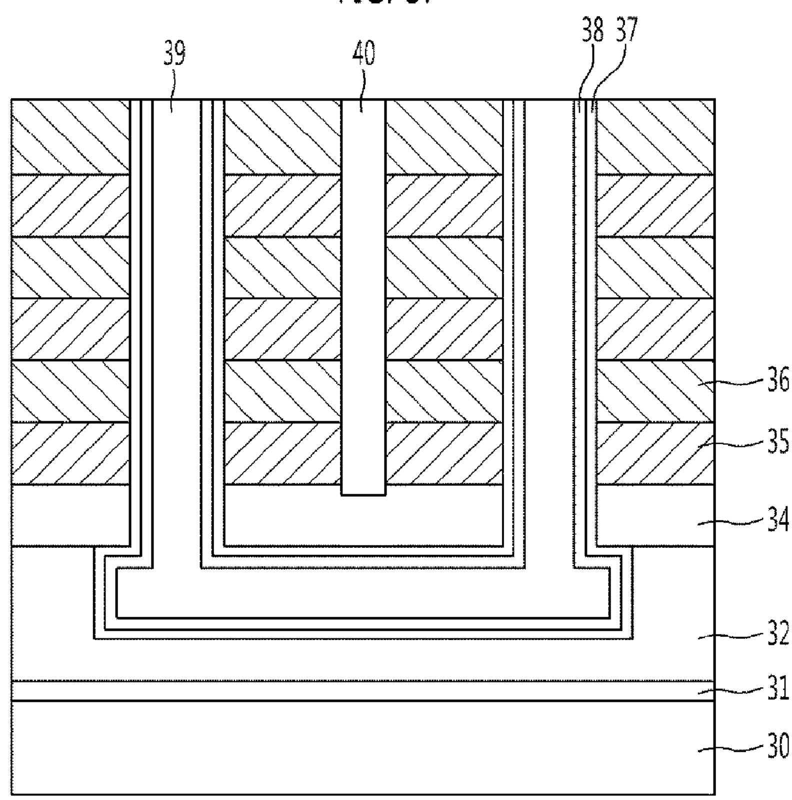

As illustrated in FIG. 3F, the second material layers 35 and the third material layers 36 may be etched to form slits between the channel holes. An etch process may be performed by using the first material layer 34 as an etch stop layer. Therefore, the memory layer 37 and the channel layer 38, under the first material layer 34, may be prevented from being damaged when the slits are formed.

In addition, the slits may be formed by using a plasma etch process. When the plasma etch process is used, the memory layer 37, under the slits and first material layer 34, may be damaged by plasma according to the type of material of the first material layer 34. For example, when the first material layer 34 comprises a conductive layer, through which current flows, such as a polysilicon layer doped with impurities, the memory layer 37 under the slits may be damaged by plasma. On the other hand, when the first material layer 34 is formed of a non-conductive layer that does not conduct current, such as a polysilicon layer not doped with impurities, the memory layer 37 under the slits may be protected from damage caused by plasma.

The slits may be deep enough to expose a surface of the first material layer 34. Alternatively, the slits may be formed by performing an over-etch process so that a portion of the surface of the first material layer 34 may be etched to a predetermined depth.

In addition, each of the slits may be formed between every two channel holes, in which case adjacent strings may have source side word lines and drain side word lines that are separate from each other. Each of the slits may be formed between a pair of the vertical channel layers that form a single string, in which case adjacent strings may have source side word lines and drain side word lines that are coupled to each other. Alternatively, the slits may be formed between some of the channel holes.

Subsequently, the slits may be filled with an insulating layer 40. As a result, memory cells may be stacked along the vertical channel layers. Depending on materials of the second material layers 35 and the third material layers 36, an additional process may precede the process of filling the slits with the insulating layer 40.

For example, the second material layer 35 may comprise a conductive layer, and the third material layer 36 may comprise an insulating layer. After the second material layers 35 exposed through the slits are silicided, each of the slits may be filled with the insulating layer 40. As a result, the memory cells may be formed.

In another example, the second material layer 35 may comprise a conductive layer, and the third material layer 36 may comprise a sacrificial layer. The third material layers 36 exposed through the slits may be removed. Subsequently, the slits and regions from which the third material layers 36 are removed may be filled with the insulating layer 40. As a result, the memory cells may be formed.

In yet another example, the second material layer 35 may comprise a sacrificial layer, and the third material layer 36 may comprise an insulating layer. The second material layers 35 exposed through the slits may be removed. Subsequently, the regions from which the second material layers 35 are removed may be filled with conductive layers formed of tungsten (W) or the like to form word lines and select lines. Subsequently, each of the slits may be filled with the insulating layer 40. As a result, the memory cells may be formed.

In the semiconductor device according to the embodiment as described above, the slits may be formed by using the first material layer 34 as an etch stop layer, so that the pipe channel layer and the memory layer 37 that surrounds the pipe channel layer may be prevented from being damaged.

Figure 4:
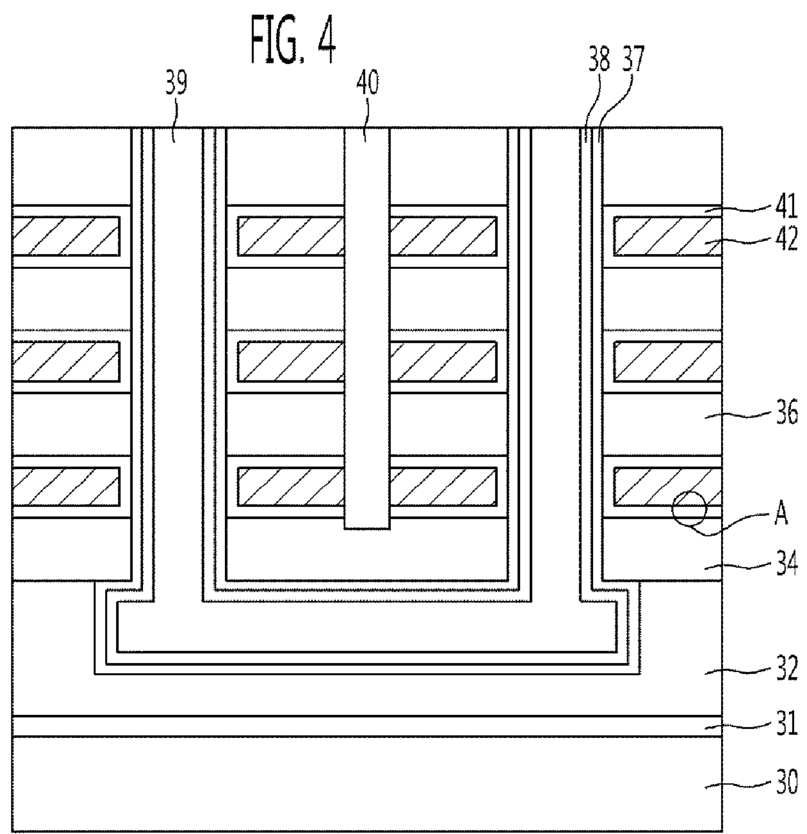
FIG. 4 is a cross-sectional view of a semiconductor device according to another embodiment of the present invention.

FIG. 4 is a cross-sectional view of a semiconductor device according to another embodiment of the present invention. The second material layer 35 may comprise a sacrificial layer, and the third material layer 36 may comprise an insulating layer.

As illustrated in FIG. 4, slits may be formed by etching the second material layers 35 and the third material layers 36 by using the first material layer 34 as an etch stop layer. Processes so far may be substantially the same as those described in the previous embodiment.

Subsequently, the second material layers 35 exposed through the slits may be removed. An oxide layer, or an oxide layer and an aluminum oxide layer ($Al_2O_3$) may be formed along an inner surface of each of the regions from which the second material layers 35 are removed, so that a charge blocking layer 41 may be further formed. Before the charge blocking layer 41 is additionally formed, the charge blocking layer 41 in the channel holes that may be damaged during removal of the second material layers 35 may be removed.

Subsequently, each of the regions from which the second material layers 35 are removed may be filled with a conductive layer 42 to form a word line or a select line.

In this case, after the charge blocking layer 41 is additionally formed in the region from which each of the second material layers 35 is removed, the region may be filled with the conductive layer 42. Therefore, the charge blocking layer 41 may be interposed between the dummy pipe gate and the lowermost word line (see reference character "A" in FIG. 4). Therefore, the charge blocking layer 41 may function as an interlayer insulating layer between the dummy pipe gate and the lowermost word line.

Figure 5:
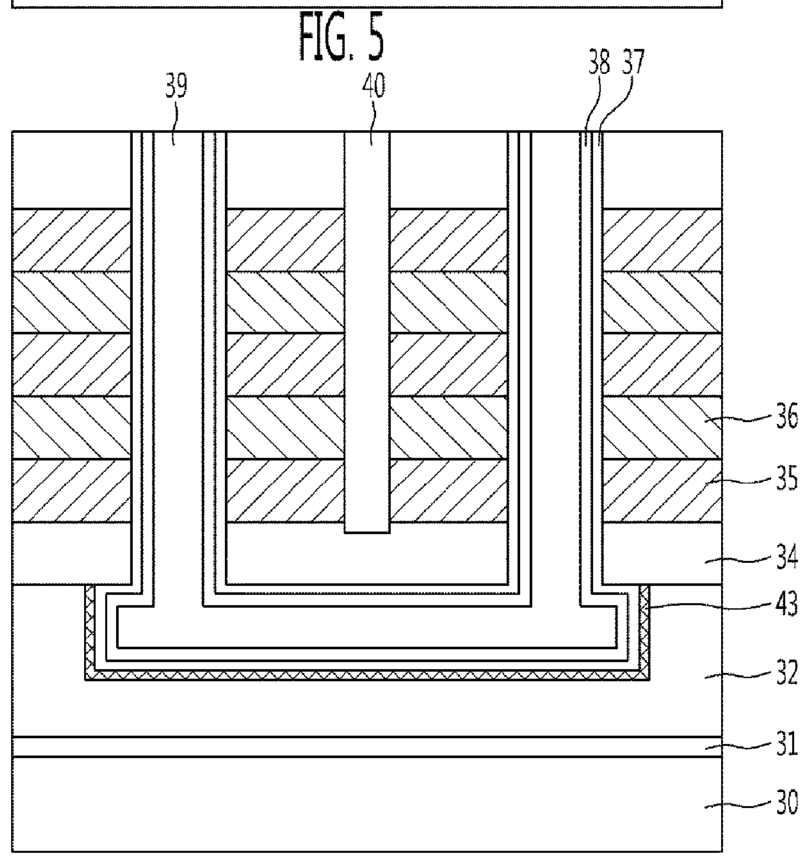
FIG. 5 is a cross-sectional view of a semiconductor device according to another embodiment of the present invention.

FIG. 5 is a cross-sectional view of a semiconductor device according to another embodiment of the present invention.

As illustrated in FIG. 5, the semiconductor device according to another embodiment may further include an insulating layer 43. The insulating layer 43 may be interposed between the memory layer 37 and the first conductive layer 32 that is configured to be used as for a pipe gate.

The insulating layer 43 may be formed along an inner surface of each of the trenches before the sacrificial layer 33 is formed in each trench, and may be deposited over the inner surface of each of the trenches. A portion of the first conductive layer 32, exposed at the inner surface of each of the trenches, may be oxidized by a predetermined thickness to form the insulating layer 43.

The insulating layer 43 and the memory layer 37 may be configured to be used as a gate insulating layer of the pipe transistor. Therefore, the final thickness of the gate insulating layer may be increased to efficiently prevent leakage current of the pipe transistor.

Figure 6:
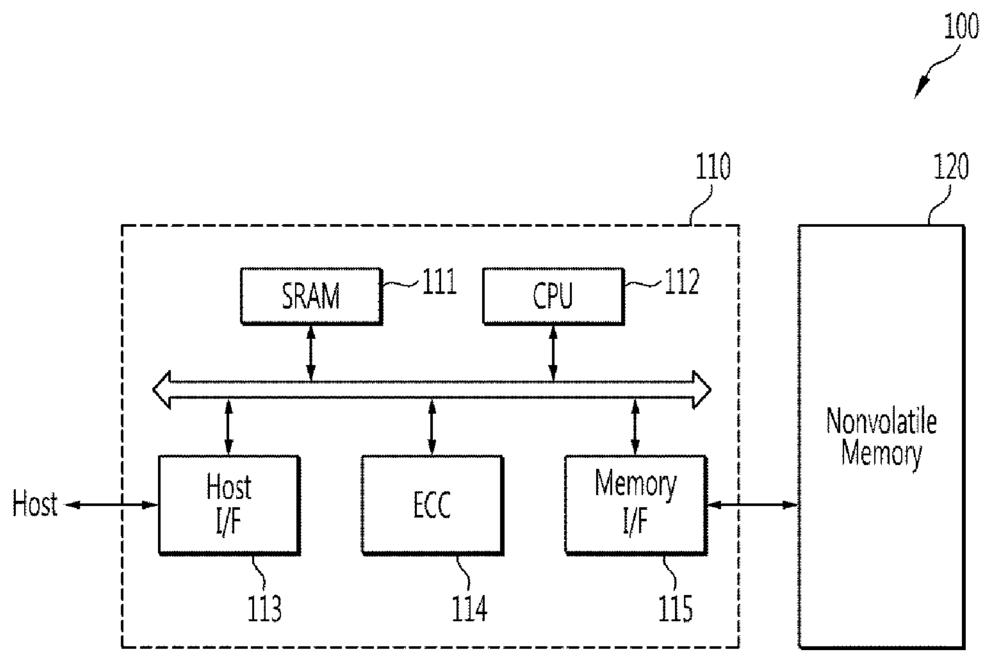
FIG. 6 is a view illustrating the configuration of a memory system according to another embodiment of the present invention.

FIG. 6 is a view illustrating the configuration of a memory system according to another embodiment of the present invention.

As illustrated in FIG. 6, a memory system 100 according to another of the present invention may include a non-volatile memory device 120 and a memory controller 110.

The non-volatile memory device 120 may have a cell array having the pipe gate including the dummy pipe gate described above in the previous embodiments. In addition, the non-volatile memory device 120 may be a multi-chip package composed of a plurality of flash memory chips.

The memory controller 110 may be configured to control the non-volatile memory device 120. The memory controller 110 may include SRAM 111, a CPU 112, a host interface 113, an ECC 114 and a memory interface 115. The SRAM 111 may function as an operation memory of the CPU 112. The CPU 112 may perform the general control operation for data exchange of the memory controller 110. The host interface 113 may include a data exchange protocol of a host being coupled to the memory system 100. In addition, the ECC 114 may detect and correct errors included in a data read from the non-volatile memory device 120. The memory interface 115 may interface with the non-volatile memory device 120. The memory controller 110 may further include RCM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including USB, MMC, PCI-E, SATA, PATA, SCSI, ESDI and IDE.

Figure 7:
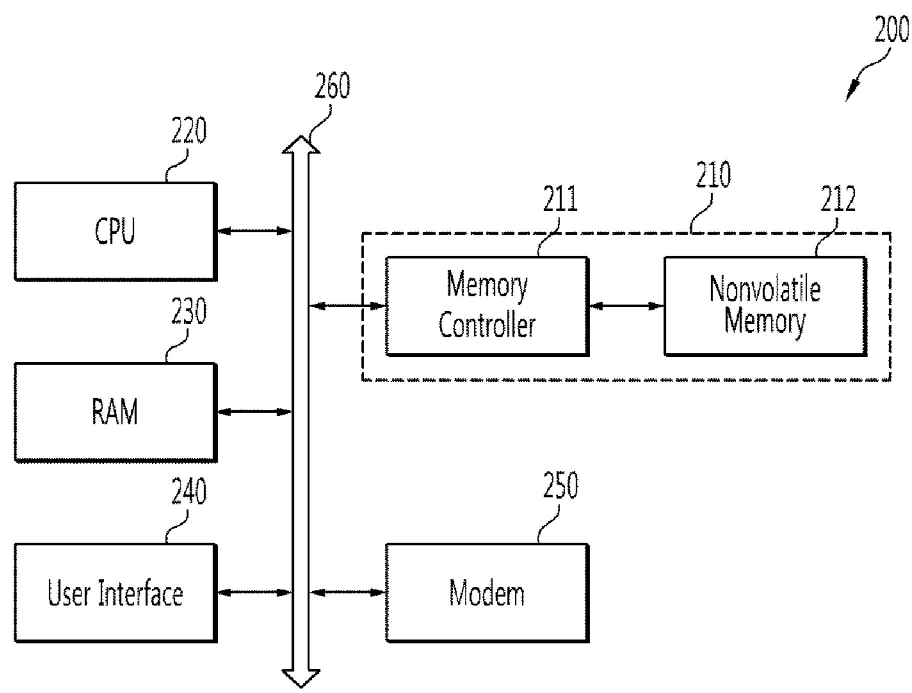
FIG. 7 is a view illustrating the configuration of a computing system according to another embodiment of the present invention.

FIG. 7 is a view illustrating the configuration of a computing system according to an embodiment of the present invention.

As illustrated in FIG. 7, a computing system 200 according to an embodiment of the present invention may include a CPU 220, RAM 230, a user interface 240, a modem 250 and a memory system 210 that are electrically coupled to a system bus 260. In addition, when the computing system 200 is a mobile device, a battery may be further included to apply operating voltage to the computing system 200. The computing system 200 may further include application chipsets, a Camera Image Processor (CIS) and mobile DRAM.

As described above in connection with FIG. 6, the memory system 210 may include a non-volatile memory 212 and a memory controller 211.

According to an embodiment of the present invention, a semiconductor device may include a dummy pipe gate that contacts a top surface of a pipe gate. Therefore, the dummy pipe gate may be configured to be used as an etch stop layer when a slit is formed, so that damage to a pipe channel layer and a memory layer surrounding the pipe channel layer may be prevented. In particular, the dummy pipe gate formed of a polysilicon layer with no impurities is included, so that damage to the memory layer surrounding the pipe channel layer may be prevented when a slit is formed by using a plasma etch process.

What is claimed is:

1. A semiconductor device, comprising:

vertical channel layers;

a pipe channel layer coupling bottoms of the vertical channel layers;

a pipe gate contacting a bottom surface and side surfaces of the pipe channel layer;

a dummy pipe gate formed of a non-conductive material and contacting a top surface of the pipe channel layer;

word lines stacked over the dummy pipe gate, wherein a lowermost word line, among the word lines, contacts a top surface of the dummy pipe gate;

interlayer insulating layers interposed between the word lines; and slits passing through the word lines and the interlayer insulating layers, wherein the slits are deep enough to expose the dummy pipe gate.

2. The semiconductor device of claim 1, wherein the dummy pipe gate is formed of an undoped polysilicon layer.

3. The semiconductor device of claim 1, wherein the pipe gate is formed of a doped polysilicon layer.

4. The semiconductor device of claim 1, wherein the pipe gate comprises either a polysilicon layer including a first type of impurities or stacked polysilicon layers, each layer alternately comprising of the first type of impurities and a second type of impurities, wherein the first and second types of impurities are different from each other.

5. The semiconductor device of claim 1, wherein the lowermost word line is configured as a dummy word line.

6. The semiconductor device of claim 1, further comprising:

a memory layer surrounding the pipe channel layer and the vertical channel layers; and an insulating layer surrounding the bottom and side surfaces of the pipe channel layer.

7. A semiconductor device, comprising:

vertical channel layers;

a pipe channel layer coupling bottoms of the vertical channel layers;

a pipe gate contacting a bottom surface and side surfaces of the pipe channel layer;

a dummy pipe gate formed of a non-conductive material and contacting a top surface of the pipe channel layer;

word lines stacked over the dummy pipe gate, wherein a lowermost word line, among the word lines, contacts a top surface of the dummy pipe gate;

interlayer insulating layers interposed between the word lines; and a charge blocking layer interposed between the dummy pipe gate and the lowermost word line.

8. The semiconductor device of claim 7, wherein the dummy pipe gate is formed of an undoped polysilicon layer.

9. The semiconductor device of claim 7, wherein the pipe gate is formed of a doped polysilicon layer.

10. The semiconductor device of claim 7, wherein the pipe gate comprises either a polysilicon layer including a first type of impurities or stacked polysilicon layers, each layer alternately comprising of the first type of impurities and a second type of impurities, wherein the first and second types of impurities are different from each other.

11. The semiconductor device of claim 7, wherein the lowermost word line is configured as a dummy word line.

12. The semiconductor device of claim 7, further comprising:

a memory layer surrounding the pipe channel layer and the vertical channel layers; and an insulating layer surrounding the bottom and side surfaces of the pipe channel layer.

* * * * *